United States Patent [19]

So et al.

[11] Patent Number: 5,587,589
[45] Date of Patent: Dec. 24, 1996

[54] TWO DIMENSIONAL ORGANIC LIGHT EMITTING DIODE ARRAY FOR HIGH DENSITY INFORMATION IMAGE MANIFESTATION APPARATUS

[75] Inventors: Franky So, Tempe; Song Q. Shi, Phoenix; Thomas B. Harvey, III, Scottsdale, all of Ariz.

[73] Assignee: Motorola, Schaumburg, Ill.

[21] Appl. No.: 408,677

[22] Filed: Mar. 22, 1995

[51] Int. Cl.⁶ .................... H01L 35/24; H01L 51/00; H01L 33/00
[52] U.S. Cl. .................................. 257/40; 257/88
[58] Field of Search ...................... 257/40, 80, 81, 257/10, 88

[56] References Cited

U.S. PATENT DOCUMENTS 4,984,034  1/1991  Yamazaki ................... 257/88
5,399,502  3/1995  Friend et al. ................ 257/80

FOREIGN PATENT DOCUMENTS 2239663  9/1990  Japan .

*Primary Examiner*—Stephen Meier
*Attorney, Agent, or Firm*—Eugene A. Parsons

[57] ABSTRACT

A two dimensional array of organic LEDs including laterally spaced, conductive strips positioned on an insulative substrate with a layer of dielectric material positioned thereon and defining cavities therethrough so as to expose areas of the conductive strips within the cavities. At least a layer of active emitter material and a layer of a low work function metal are positioned in each of the cavities on the conductive strips so as to form an LED in each cavity with the conductive strips forming a first electrode of each LED. A layer of metal is sealing positioned over each of the cavities and formed into metallic strips orthogonal to the conductive strips so as to form a second electrode for each of the LEDs.

19 Claims, 1 Drawing Sheet

5,587,589

TWO DIMENSIONAL ORGANIC LIGHT EMITTING DIODE ARRAY FOR HIGH DENSITY INFORMATION IMAGE MANIFESTATION APPARATUS

FIELD OF THE INVENTION

The present invention relates to organic light emitting diode (LED) arrays and to a novel method of fabrication of organic LED arrays for high density information image manifestation apparatus applications.

BACKGROUND OF THE INVENTION

A two-dimensional organic LED array for image manifestation apparatus applications is composed of a plurality of organic LEDs (one or more of which form a pixel) arranged in rows and columns. Each individual organic LED in the array is generally constructed with a light transmissive first electrode, an organic electroluminescent medium deposited on the first electrode, and a metallic electrode on top of the organic electroluminescent medium. The electrodes of the LEDs are connected to form a two-dimensional X-Y addressing pattern. In practice, the X-Y addressing pattern is achieved by patterning the light transmissive electrodes in an X direction and patterning the metallic electrodes in a Y direction (or vice versa if desired), with the X and Y directions being perpendicular to each other. The patterning of the electrodes is usually accomplished by either shadow mask or etching techniques. Due to the technical limits of shadow masks, only etching processes are being utilized for high density information displays, which have pixel pitches less then 0.1 mm.

Depending on the medium used in the etching processes, the etching technique can be divided into two categories: wet and dry. While wet etching is performed in an acidic liquid medium, dry etching is usually done in a plasma atmosphere.

The metallic electrodes used for cathode contacts in organic LEDs usually contain a stable metal and a highly reactive metal with a work function less then 4 eV. The presence of the highly reactive metal in the metallic electrode makes acid-based wet etching undesirable. However, the dry etching processes is also problematic because of the high temperature (>200° C.) and reactive ion atmosphere required in the process, which may affect the integrity of the organic materials as well as the active metal containing metallic electrodes in a two-dimensional organic LED array.

To overcome the etching dilemma, a shadow wall method to fabricate the two-dimensional array has been disclosed by Tang in a patent application, EP92 122113.1, published by the European Patent Office on Jul. 7, 1993. The shadow wall method includes: patterning the transparent electrode first; building dielectric walls that are orthogonal to the transparent electrodes, capable of shadowing an adjacent pixel area, and with a height exceeding the thickness of the organic medium; depositing an organic electroluminescent medium; and depositing the cathode metals from an angle of 15° to 45° with respect to the deposition surface. Since the height of the dielectric walls exceeds the thickness of the organic medium, isolated parallel metal stripes are formed. Thus, a X-Y addressable array is achieved without the need of metal etching. Though this method seems to be viable for metal patterning, it is limited to certain pitch dimensions, and potentially could introduce defects in pixels in the array.

Accordingly, it would be highly advantageous to provide a new LED array and method of manufacturing which overcame these problems.

It is a purpose of this invention to provide a novel method of fabricating a two-dimensional organic LED array for high density information image manifestation apparatus applications.

It is another purpose of this invention to provide an organic LED device structure on which metal etching can be performed.

It is still another purpose of this invention to provide a passivated two-dimensional organic LED array for high density information image manifestation apparatus applications with improved reliability.

It is a further purpose of this invention to provide a new device structure for use in LED arrays which is relatively easy and inexpensive to manufacture.

SUMMARY OF THE INVENTION

The above problems and others are at least partially solved and the above purposes and others are realized in a new and novel two-dimensional organic LED array for high density information image manifestation apparatus applications. The LED array includes a number of parallel, spaced apart light transmissive first electrodes, an electroluminescent medium deposited on the first electrodes, and on top of the electroluminescent medium a number of parallel, spaced apart metallic second electrodes arranged orthogonal to the first electrodes. The electroluminescent medium is enclosed in a well or trench structure formed of dielectric medium with the light transmissive first electrode at the well or trench bottom and the second electrode of ambient stable metal at the top of the well or trench.

A novel method of fabrication of a two-dimensional organic LED array for high density information image manifestation apparatus applications is also disclosed.

DESCRIPTION OF THE PREFERRED EMBODIMENTS

Figure 1:
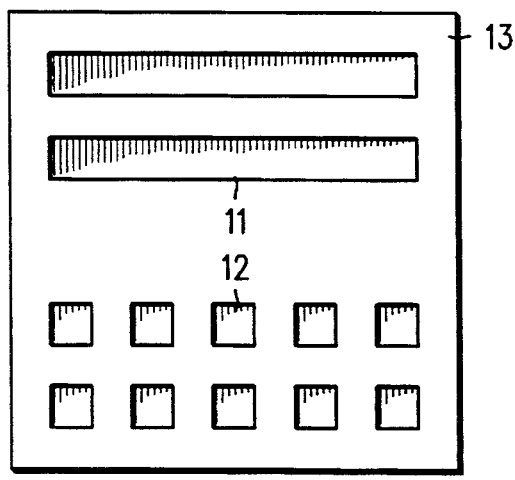
FIG. 1 is a plan view of a typical trench structure and a typical well structure depicted on the same substrate to illustrate their dimensional differences.

Since device feature dimensions are often in sub-micrometer ranges, the drawings are scaled for ease of visualization rather than dimensional accuracy. Referring specifically to FIG. 1, a plan view of typical trench 11 and well 12 structures is depicted on the same substrate to illustrate their dimensional differences. Both trenches 11 and wells 12 are generally formed by photolithographically patterning a dielectric layer 13 that has been deposited on top of light transmissive, conductive strips (not shown) that are in turn supported by an underlying transparent insulating substrate.

Trenches 11 are long, narrow, straight, deep depressions, each defined by four relatively steep sides formed in dielectric layer 13. Typically, trenches 11 take the shape of a rectangular parallelepiped as shown in FIG. 1. Also, trenches 11 generally extend across the substrate in a direction either perpendicular to the underlying light transmissive, conductive strips or parallel to and on the top of the underlying light transmissive, conductive strips. A number of LEDs or pixels can be constructed in a single trench 11.

Wells 12 are each defined by a hole formed in dielectric layer 13 with a rectangular, square or circular shape of opening, and steep side walls. Wells 12 are characterized by small feature size and a nearly isotropic shape of opening. A number of wells 12 are constructed in a row across the substrate on the top of the light transmissive, conductive strips. Each well 12 defines the shape of an LED or pixel in a two-dimensional array. Either trenches 11 or wells 12, which are hereinafter referred to generally as cavities, can be used in the fabrication of a two-dimensional array for information image manifestation apparatus.

Figure 2:
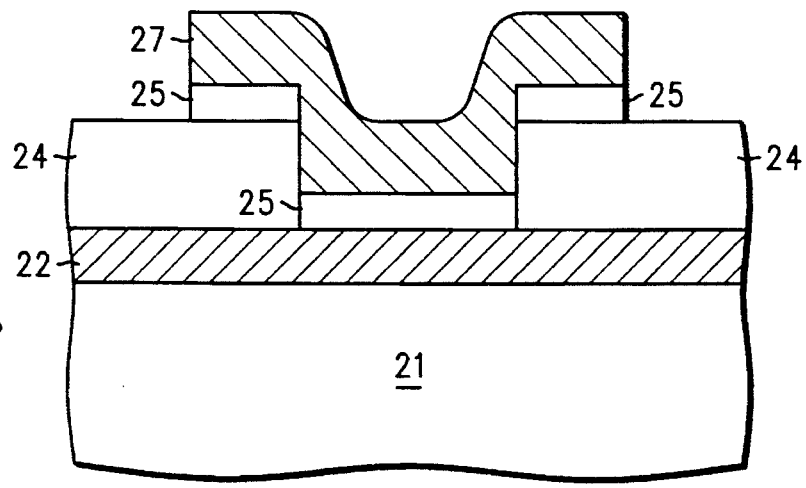
FIG. 2 is a cross sectional view of an LED in a two dimensional array according to the present invention.

Now referring specifically to FIG. 2, a cross sectional view of a single LED 20, from a two dimensional LED array according to the present invention, is depicted. The construction of LED 20 begins with a light transmissive, preferably transparent, and electrically insulative substrate 21. Substrates made of glass and polymeric materials are generally preferred. On the upper surface of substrate 21 is deposited a layer 22 of light transmissive, electrically conductive material, which is selected from a variety of organic or inorganic conductors, such as conductive polyaniline (PANI), or indium-tin-oxide (ITO). Layer 22 is then patterned by conventional lithography technique to form a first parallel conductive strip 23 that is capable of being addressed in a row fashion and will serve as an anodic electrode in the final array.

On the top of patterned layer 22, a layer 24 of D dielectric medium is deposited by thermal evaporation, sputtering or plasma enhanced chemical vapor deposition techniques. Layer 24 is then patterned by conventional wet or dry etch techniques to form a cavity (well or a trench) structure. Inside the cavity, and on the upper surface of layer 23 (the anodic electrode), is deposited an electroluminescent medium 25, which generally consists of a layer of hole transporting material, a layer of active emitter material, a layer of electron transporting material and a layer of a low work function metal. It will of course be understood by those skilled in the art that in some applications either or both of the layers of hole transporting material and electron transporting material can be eliminated, in most instances with a result of somewhat poorer operation.

The top of the cavity is then sealed by evaporation of a thick layer 27 of stable metal such as aluminum, silver, copper or gold as a cavity cap. Layer 27 is selected to form a good electrical contact with the layer of low work function material in electroluminescent medium 25 and, in conjunction with the layer of low work function metal of electroluminescent medium 25, forms the cathode electrode for LED 20. Layer 27 is then lithographically patterned to form an isolated metal strip to provide LED addressing, as previously described.

Dielectric medium 24, used in the construction of the cavity structure, is any convenient organic polymer or inorganic material. However, it is preferred to use an inorganic dielectric material such as silicon dioxide, silicon nitride, alumina, etc. which is usually a better barrier to oxygen and moisture then organic polymer materials. The thickness of dielectric medium 24, which determines the depth of the cavity structures, may vary from 10 µm to 0.1 µm and, for ease of processing, a thickness of less then 1 µm is preferred.

The materials used as electroluminescent medium 25 in the two-dimensional array of this invention can include any of the materials of organic EL devices disclosed in the prior art. As stated above, electroluminescent medium 25 generally consists of a layer of hole transporting material, a layer of active emitter material, a layer of electron transporting material and a layer of low work functional metal. Polymers, organic molecules and organometallic complexes can be used as hole transporting materials, active emitters and electron transporting materials. In the active emitter layer, a fluorescent dopant used for enhancement of the device efficiency can also be incorporated. Generally, any metals with a work function less than approximately 4.0 eV can be used as the cathode material, e.g. lithium, magnesium, indium, calcium, etc.

The organic electroluminescent media can be deposited by vacuum evaporation. Organic electroluminescent media can also be deposited by other techniques such as injection-fill, spin-coating, roll-coating, dip-coating or doctor-blading from a suitable solution when polymeric materials are used. A mixture of the above-mentioned techniques may be needed in cases where a heterostructure array composed of both small organic molecule materials and polymers is to be built.

Figure 3:
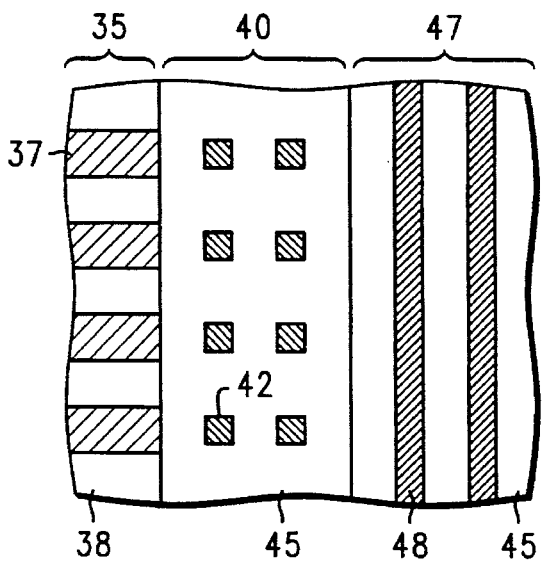
FIG. 3 is a plan view of a two dimensional organic LED array with well structures in accordance with the present invention, portions thereof broken away for ease of visualization.

Referring now to FIG. 3, a plan view of a two-dimensional array 30 of LED well structures embodying the present invention is illustrated, with portions broken away for ease of visualization. Proceeding from left to right in FIG. 3, an area 35 is a plan view of array 30 at a stage where patterned transmissive, conductive strips 37, forming row (anode) electrodes, are positioned on a light transmissive, electrically insulative substrate 38.

A central area 40 in FIG. 3 illustrates a stage where individual LEDs 42 are defined by wells containing organic electroluminescent medium and low (less than 4.0 eV) work function metal as an n-contact (cathode). The wells are formed in the array after depositing a layer of dielectric medium 45 on top of patterned strips 37 and substrate 38 and patterning the dielectric medium 45 photolithographically to form the well structures, as illustrated in area 40.

An area 47 is a plan view of the array after a layer of an ambient stable metal cap has been deposited on top of dielectric medium 45 with the well structures formed therein (area 40) and patterned into metal strips 48 as column electrodes.

An array bearing trench structures can be fabricated in the same fashion as the array bearing well structures, with the exception that the orientation of the trench structures can be either parallel to and on top of conductive strips 37 or perpendicular to and across all of conductive strips 37. When the trench structures are oriented parallel to and on top of conductive strips 37, two sides of each pixel are exposed after metal strips 48 are patterned orthogonal to conductive strips 37 to form an X-Y matrix. However, the exposed portions of array 30 would adversely affect the integrity of the organic electroluminescent medium and the low work function metal during the cap metal patterning. Thus, it is preferred that the trench structures be oriented perpendicular to and across all conductive strips 37 in array 30.

The number of LEDs and the LED pitch, that is the diameter of a well or the width of a trench in an array, needed for high density information image manifestation apparatus are dependent upon the resolution and size of the image manifestation apparatus required for a specific application. For example, 640×480 LEDs with LED pitch around 0.3 mm will be needed for a 10 inch diagonal monochrome VGA type of image manifestation apparatus. The LED pitch is confined only by the limit of lithography technology, which is around 0.5 µm in current manufacturing technology.

Two-dimensional array 30 has superior stability over arrays disclosed in the prior art. The organic electroluminescent medium, including the n-contact of low work function metal, in LEDs 42 (well structures) or a row of LEDs (trench structures) are enclosed in a cavity by light transmissive conductive strips 37 at the bottom, dielectric medium 45 on the sides and a stable metal cap (metal strips 48) on the top. The disclosed cavity structures significantly reduce the degradation of the array by ambient (oxygen and moisture) conditions.

In operation, a pattern of light emission from array 30 can be seen at the bottom surface of transparent substrate 38, through appropriate addressing and control of array 30 in a well known manner. Array 30 is driven to emit light by a programmed electronic driver (not shown), which sequentially addresses one row of pixels at a time and repeats the addressing sequence at such a rate that the interval between repeated addressing of the same row is less than the detection limit of the human eye, typically less that 1/60th of a second. The viewer sees an image formed by the light emission from all of the addressed rows, though the device at any moment is emitting from only one row.

Thus, a two dimensional array of LEDs for high density information image manifestation apparatus and fabrication methods are disclosed. The two dimensional array is fabricated by a novel method involving cavities in which the organic electroluminescent medium, including the n-contact of low work function metal, is protected from any etchants used during the fabrication process and from ambient conditions subsequent to fabrication. Thus, an organic LED device structure is disclosed on which metal etching can conveniently be performed without deleterious results. Also, the cavity structure provides a passivated two-dimensional organic LED array for high density information image manifestation apparatus applications with improved reliability. Further, because the cavity structure protects the organic electroluminescent medium, including the n-contact of low work function metal, from damage by etchants, the LED arrays are relatively easy and inexpensive to manufacture.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A two dimensional organic light emitting diode array comprising:

an electrically insulative supporting substrate;

a plurality of laterally spaced apart, electrically conductive strips positioned on a surface of the supporting substrate so as to define a plurality of first electrodes;

a layer of dielectric medium positioned on an upper surface of the electrically conductive strips and the supporting substrate and defining a plurality of cavities through the layer of dielectric medium, one each of the plurality of cavities being positioned in overlying relationship to an associated first electrode of the plurality of first electrodes so as to expose a portion of an upper surface of the associated first electrode, and the layer of dielectric medium defining the plurality of cavities with each cavity defining an upper opening substantially equal in area to the exposed portion of the associated first electrode; and an electroluminescent medium, including at least a layer of active emitter material and a layer of a low work function metal, positioned in each of the plurality of cavities on the exposed portion of the associated first electrode so as to form a light emitting diode in each of the plurality of cavities in conjunction with the associated first electrode; and a layer of ambient stable metal sealingly positioned over the cavities so as to electrically contact the low work function metal in each of the cavities and to seal the upper openings in each of the cavities, the layer of ambient stable metal defining a plurality of laterally spaced apart, metallic strips orthogonal to the electrically conductive strips, the laterally spaced apart, metallic strips defining a second electrode for each of the light emitting diodes.

2. A two dimensional organic light emitting diode array as claimed in claim 1 wherein the electrically insulative supporting substrate and the plurality of laterally spaced apart, electrically conductive strips are light transmissive.

3. A two dimensional organic light emitting diode array as claimed in claim 1 wherein the electroluminescent medium includes a layer of hole transporting material between the conductive strips and the layer of active emitter material, and a layer of electron transporting material between the layer of active emitter material and the layer of a low work function metal.

4. A two dimensional organic light emitting diode array as claimed in claim 1 wherein the supporting substrate, the conductive strips and the dielectric medium each includes one of an organic polymer and an inorganic material.

5. A two dimensional organic light emitting diode array as claimed in claim 4 wherein the supporting substrate is formed of glass.

6. A two dimensional organic light emitting diode array as claimed in claim 4 where the first electrodes are formed of indium-tin-oxide.

7. A two dimensional organic light emitting diode array as claimed in claim 4 wherein the dielectric medium is formed of silicon dioxide, silicon nitride, or alumina.

8. A two dimensional organic light emitting diode array as claimed in claim 1 wherein the dielectric medium is formed with a thickness in a range of from 10 µm to 0.1 µm.

9. A two dimensional organic light emitting diode array as claimed in claim 1 wherein the dielectric medium is formed with a thickness less then 1 µm.

10. A two dimensional organic light emitting diode array as claimed in claim 1 wherein each cavity is defined as a well formed in the dielectric layer with one of a rectangular, square and circular shape of opening, and substantially vertical side walls.

11. A two dimensional organic light emitting diode array as claimed in claim 1 wherein the electroluminescent medium includes forms of organic, organometallic, polymeric or combinations of those materials as the layer of hole transporting material, the layer of active emitter material and the layer of electron transporting material.

12. A two dimensional organic light emitting diode array as claimed in claim 1 wherein the layer of active emitter material in the electroluminescent medium determines the emission hue of the array.

13. A two dimensional organic light emitting diode array as claimed in claim 1 wherein each of the layers forming the electroluminescent media is deposited by one of the following methods: sputtering, thermal evaporation, injection-fill, spin-coating, roll-coating, dip-coating and doctor-blading.

14. A two dimensional organic light emitting diode array as claimed in claim 1 where the low work function metal in the electroluminescent medium includes one of lithium, magnesium, indium, or calcium.

15. A two dimensional organic light emitting diode array as claimed in claim 1 wherein the metal sealingly positioned over the cavities and defining a plurality of laterally spaced apart, metallic strips includes one of aluminum, silver, copper or gold.

16. A two dimensional organic light emitting diode array comprising:

- an electrically insulative, light transmissive supporting substrate;
- a plurality of laterally spaced apart, parallel, light transmissive, electrically conductive strips arranged in rows on an upper surface of the electrically insulative, light transmissive supporting substrate so as to define a plurality of first electrodes;
- a layer of dielectric medium deposited over the conductive strips and the electrically insulative, light transmissive substrate and defining a plurality of cavities positioned in columns orthogonal to the plurality of conductive strips and each cavity exposing an upper surface of an associated conductive strip at each of the defined plurality of first electrodes, and the layer of dielectric medium defining the plurality of cavities with each cavity defining an upper opening substantially equal in area to the exposed upper surface of the associated conductive strip;
- an electroluminescent medium including a layer of hole transporting material, a layer of active emitter, a layer of electron transporting material, and a layer of a low work function metal deposited on the exposed upper surface of the associated conductive strip in each of the cavities; and
- an ambient stable metal sealingly positioned over each of the cavities and in electrical engagement with the low work function metal so as to seal the upper opening defined by each of the cavities, the ambient stable metal being connected to form a number of laterally spaced, parallel, metallic strips arranged in columns orthogonal to the conductive strips.

17. A two dimensional organic light emitting diode array as claimed in claim 16 wherein the dielectric medium is formed with a thickness in the range of from 10 $\mu$m to 0.1 $\mu$m, preferably less then 1 $\mu$m.

18. A two dimensional organic light emitting diode array as claimed in claim 16 wherein the dielectric medium is formed with a thickness of less then 1 $\mu$m.

19. A two dimensional organic light emitting diode array as claimed in claim 16 wherein each cavity is a trench defined as an elongated depression with four substantially vertical sides formed in the dielectric layer, generally in a shape of a rectangular parallelepiped and extending across the substrate in a plane of the substrate.

* * * * *